United States Patent
Torii et al.

(10) Patent No.: US 11,511,535 B2
(45) Date of Patent: Nov. 29, 2022

(54) SCREEN PRINTER HAVING MASK PRESSING DEVICE FOR DETERMINING TENSION OF MASK BY CALCULATING MASK DEFLECTION AMOUNT

(71) Applicant: FUJI CORPORATION, Chiryu (JP)

(72) Inventors: Atsushi Torii, Toyota (JP); Koki Hayashi, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 315 days.

(21) Appl. No.: 16/769,442

(22) PCT Filed: Dec. 15, 2017

(86) PCT No.: PCT/JP2017/045136
§ 371 (c)(1),
(2) Date: Jun. 3, 2020

(87) PCT Pub. No.: WO2019/116545
PCT Pub. Date: Jun. 20, 2019

(65) Prior Publication Data
US 2020/0369022 A1    Nov. 26, 2020

(51) Int. Cl.
*B41F 15/36*    (2006.01)
*B41F 15/12*    (2006.01)
(Continued)

(52) U.S. Cl.
CPC ............ *B41F 15/36* (2013.01); *B23K 3/0638* (2013.01); *B41F 15/44* (2013.01); *H05K 3/3452* (2013.01);
(Continued)

(58) Field of Classification Search
None
See application file for complete search history.

(56) References Cited

U.S. PATENT DOCUMENTS

2016/0200096 A1    7/2016    Kuroda et al.

FOREIGN PATENT DOCUMENTS

EP    3 112 154 A1    1/2017
JP    8-300615 A    11/1996
(Continued)

OTHER PUBLICATIONS

International Search Report dated Feb. 13, 2018 in PCT/JP2017/045136 filed Dec. 15, 2017, 2 pages.

*Primary Examiner* — Leslie J Evanisko
(74) *Attorney, Agent, or Firm* — Oblon, McClelland, Maier & Neustadt, L.L.P.

(57) ABSTRACT

A screen printer that measures a tension of a mask in a machine, including a mask holding device configured to hold a mask; a board device configured to position a board from below with respect to the mask held by the mask holding device; a squeegee device configured to apply and spread a cream solder on an upper surface of the mask; a mask pressing device configured to press the mask at a set pressure by a pusher which is installed on an upper travelling device or a lower travelling device with respect to the mask; a mask measurement device, installed on the upper travelling device or the lower travelling device to be opposed to the pusher, which is configured to measure a height of the mask; and a tension measurement device configured to calculate a tension of the mask based on a measured value of the mask measurement device.

8 Claims, 5 Drawing Sheets

(51) Int. Cl.
*B23K 3/06* (2006.01)
*B41F 15/44* (2006.01)
*H05K 3/34* (2006.01)
*B23K 101/42* (2006.01)

(52) U.S. Cl.
CPC .. *B23K 2101/42* (2018.08); *H05K 2203/0139* (2013.01); *H05K 2203/163* (2013.01)

(56) References Cited

FOREIGN PATENT DOCUMENTS

| | | | | |
|---|---|---|---|---|
| JP | 2001-62996 | A | 3/2001 | |
| JP | 2007-96153 | A | 4/2007 | |
| JP | 2007-320207 | A | 12/2007 | |
| JP | 2011-189673 | A | 9/2011 | |
| JP | 2013-22743 | A | 2/2013 | |
| WO | WO-2014080010 | A1 * | 5/2014 | .......... B41F 15/0881 |

* cited by examiner

SCREEN PRINTER HAVING MASK PRESSING DEVICE FOR DETERMINING TENSION OF MASK BY CALCULATING MASK DEFLECTION AMOUNT

TECHNICAL FIELD

The present application relates to a screen printer capable of measuring a tension of a mask in a machine.

BACKGROUND ART

In a screen printer, a board is disposed under a mask in which print pattern holes are formed, and a cream solder is spread over an upper surface of the mask. Then, the board is applied with the cream solder through the print pattern holes, whereby printing according to the print pattern is performed on the board. In such a moment, when the mask separation after printing is not appropriate, a printing defect such as blurring of the print pattern occurs. This is partly because the tension of the mask to be repeatedly used is loosened, and as a result the degree of contact between the mask and the board is deviated occasionally. In this regard, Patent Literature 1 below describes the measurement of the tension of a mask. Specifically, a tension measuring rod provided in the print head is used for pressurizing a measurement point of the mask with a predetermined thrust, so that a reaction force so generated is measured by a load cell. In addition, there is also a description of measuring an actual tension reaction force by monitoring means using a recognition camera.

PATENT LITERATURE

Patent Literature 1: JP-A-2007-96153
Patent Literature 2: JP-A-2001-62996

BRIEF SUMMARY

Technical Problem

In the conventional art disclosed in Patent Literature 1, reaction force measurement with a mask being pushed by a rod is performed as means for determining a mask tension. However, since the mask separation of the board is caused by the deflection amount of the mask, the mask separation after printing cannot be appropriately controlled based on the value of the reaction force measurement. In this regard, Patent Literature 2 discloses a mask tension measurement device for measuring the displacement amount of a mask as an external device of a screen printer. In the tension measurement device, for the purpose of applying a constant load to a mask that is supported at both left and right ends, a weight is placed on the mask, and the displacement amount so generated is measured by a gap sensor as the tension of the mask. However, as described in the example in the related art, the device configured as an external device of the screen printer is not only expensive, but also has a drawback of the size of a board manufacturing line becoming larger. In addition, a method for applying the load to the mask using the weight is inconvenient to handle and adjust the load.

In order to solve this problem, an object of the present disclosure is to provide a screen printer capable of measuring the tension of a mask in a machine.

Solution to Problem

According to an aspect of the present disclosure, there is provided a screen printer including: a mask holding device configured to hold a mask; a board device configured to position a board from below with respect to the mask held by the mask holding device; a squeegee device configured to apply and spread a cream solder on an upper surface of the mask; a mask pressing device configured to press the mask at a set pressure by a pusher which is installed on an upper travelling device or a lower travelling device with respect to the mask; a mask measurement device, being installed on the upper travelling device or the lower travelling device so as to be opposed to the pusher, which is configured to measure a height of the mask; and a tension measurement device configured to calculate a tension of the mask based on a measured value of the mask measurement device.

Advantageous Effects

According to the configuration, in the screen printer, the mask is pressed from above or below the mask by the pusher of the mask pressing device at a set pressure, the height of the deflected mask is measured by the mask measurement device from the side opposite to the pusher, and a value related to the tension of the mask is calculated by the tension measurement device based on the measured value.

DESCRIPTION OF EMBODIMENTS

Figure 1:
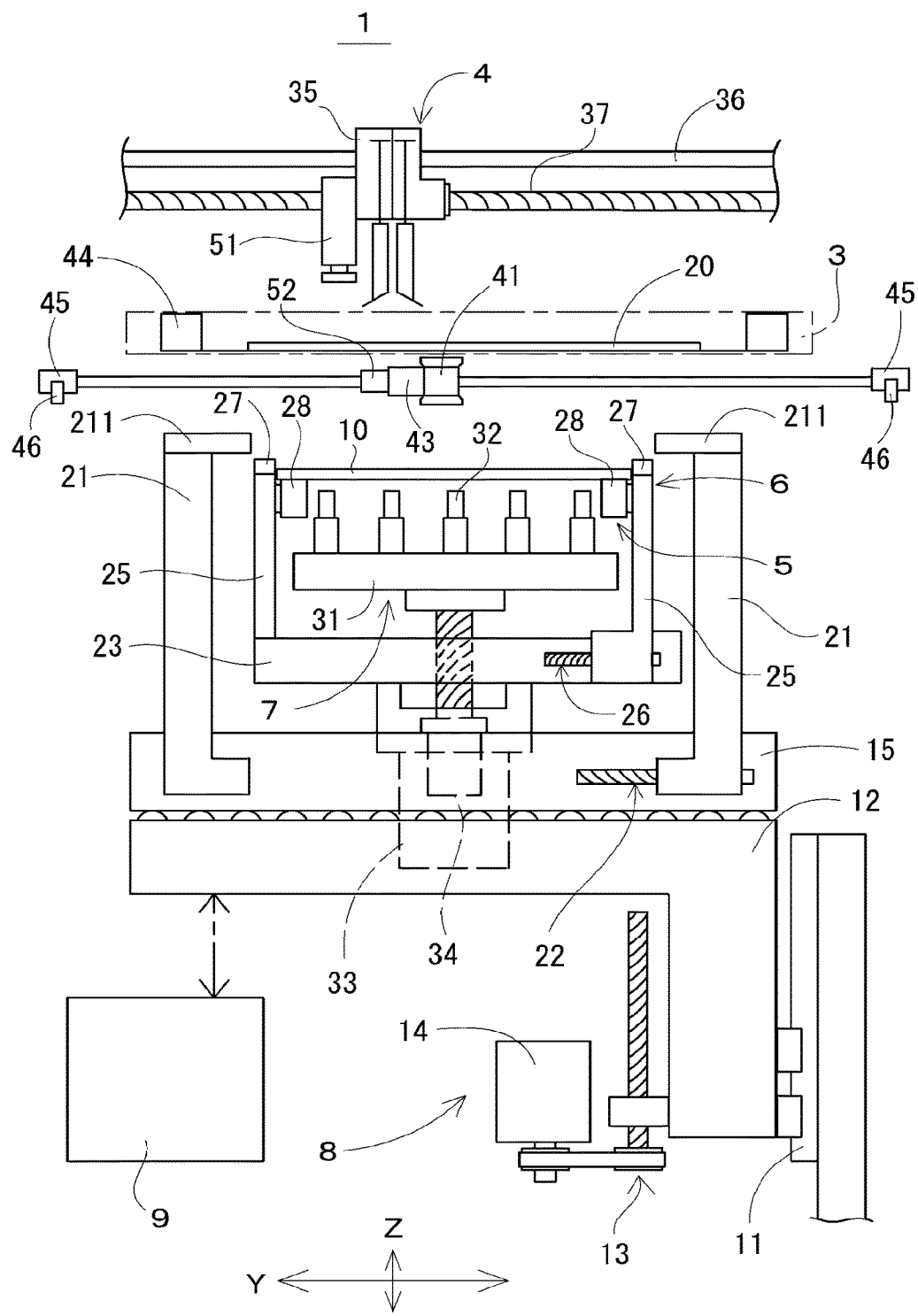
FIG. 1 is a simplified view illustrating an internal structure of a screen printer.
Figure 2:
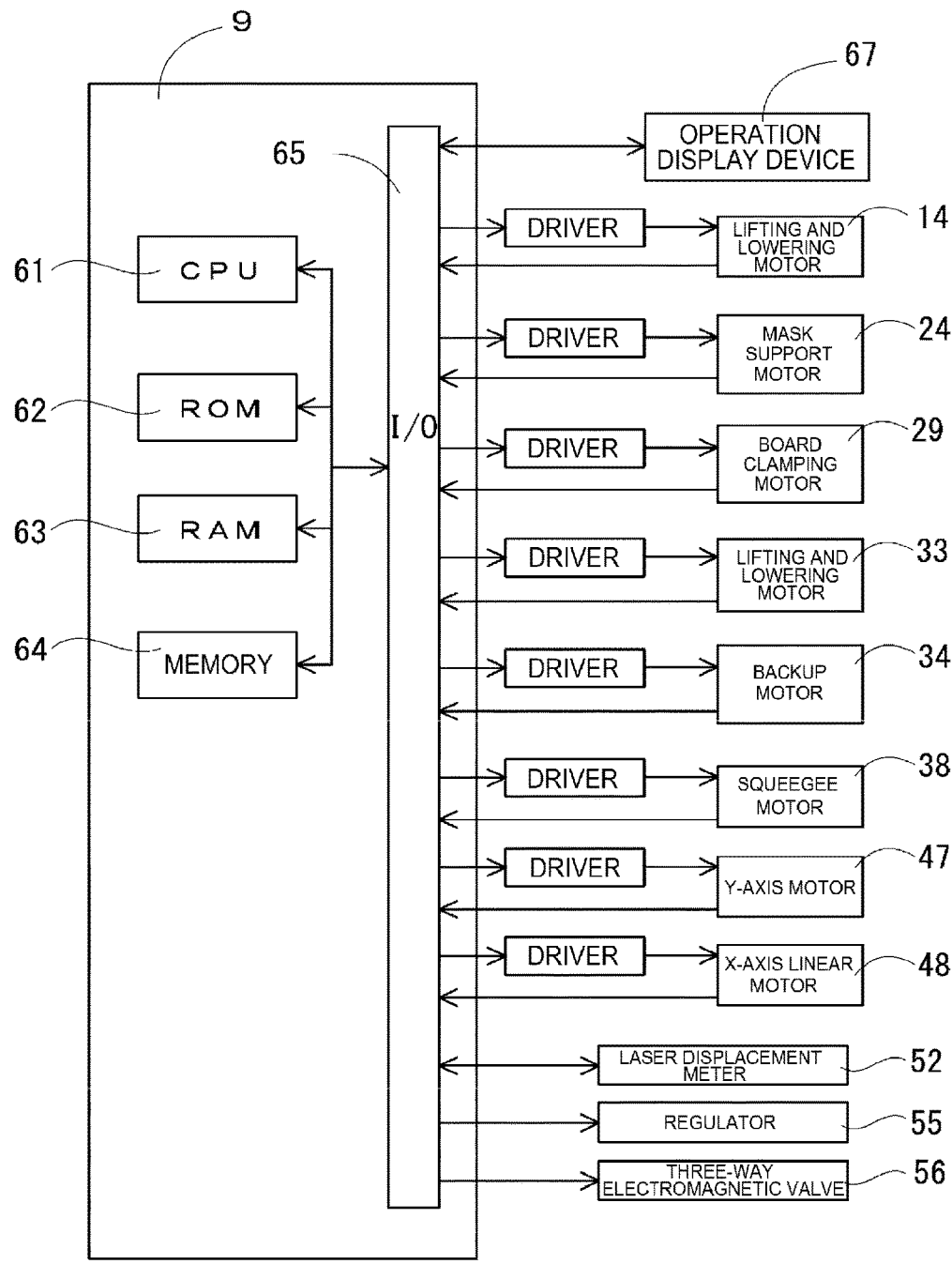
FIG. 2 is a simplified block diagram illustrating a control system of the screen printer.

Next, an embodiment of a screen printer according to the present disclosure will be described below with reference to the drawings. FIG. 1 is a simplified view illustrating an internal structure of the screen printer, and illustrating from a machine width direction which is a conveyance direction of a board. FIG. 2 is a simplified block diagram illustrating a control system of the screen printer. Screen printer 1 prints a cream solder on a board, and configures a circuit board production line together with, for example, a solder inspector that inspects a print state, a component mounter that mounts electronic components on a board, and the like. In the circuit board production line, the boards are conveyed in order to each machine, and in screen printer 1, board 10 is conveyed in and out in the machine width direction through the drawing. In the present embodiment, the machine front-rear direction of screen printer 1 will be described as the Y-axis direction, the machine width direction will be described as the X-axis direction, and the machine height direction will be described as the Z-axis direction.

In screen printer 1, board 10 is conveyed under mask 20 installed in the machine, and the print pattern is formed such that the cream solder passes through the print pattern hole from the upper surface side of mask 20, and board 10 on the lower side is applied with the cream solder. Therefore, mask 20 is held on the upper portion side in screen printer 1 via frame body 44 by a pair of mask holders 3 arranged in the machine width direction, Squeegee device 4 is installed on the upper side of mask holder 3, and is attached in a state of being movable in the machine front-rear direction. Meanwhile, on the lower side of mask holder 3, board conveyance device 5 that conveys in and out board 10 in the machine width direction, clamping device 6 for clamping board 10 in the machine front-rear direction, and backup device 7 that raises and lowers board 10 to and from a clamping position, and the like are assembled to lifting and lowering device 8.

Lifting and lowering device 8 includes a lifting and lowering base 12 that slides along perpendicular guide rail 11, and lifting and lowering base 12 is connected to lifting and lowering motor 14 via ball screw mechanism 13. Board conveyance device 5, clamping device 6, and the like are installed on lifting and lowering base 12 via support table 15. Support table 15 is provided with a pair of mask supports 21 in the machine front-rear direction (Y-axis direction), and mask supporting plates 211 which are in contact with mask 20 on the upper surface are fixed, respectively. Ball screw mechanism 22 is formed in mask support 21 on the right side of the drawing, and the distance to mask support 21 on the left side of the drawing can be adjusted by mask support motor 24.

Clamping device 6 has a pair of side frames 25 in the machine front-rear direction orthogonal to the conveyance direction of board 10, and is assembled on support table 23. Ball screw mechanism 26 is formed in side frame 25 on the right side of the drawing, and the distance to side frame 25 on the left side of the drawing can be adjusted by board clamping motor 29. Clamp sections 27 are formed in the upper end portions of the pair of side frames 25, and board 10 can be gripped by reducing the distance between clamp sections 27. Board conveyance device 5 including conveyor belt 28 is assembled to the inner side of side frame 25.

Backup device 7 that supports board 10 is provided between the pair of side frames 25. Backup device 7 is configured such that backup table 31 having multiple backup pins 32 is supported via a ball screw mechanism, and is raised and lowered by backup motor 34. Support table 23 is configured to be supported by a ball screw mechanism, and raised and lowered by lifting and lowering motor 33. The positions of clamping device 6 and support table 15 of backup device 7 can be adjusted in the X-direction, the Y-direction, and the θ direction on the X-Y plane with respect to lifting and lowering base 12.

In squeegee device 4, a pair of squeegees are installed on traveling table 35 via a lifting and lowering device such as a cylinder. Traveling table 35 is slidably assembled to guide rod 36 extending in the machine front-rear direction, and is attached via a ball screw mechanism including screw shaft 37 parallel to guide rod 36. Therefore, squeegee device 4 can move linearly in the machine front-rear direction by driving squeegee motor 38 connected to the screw shaft.

Meanwhile, below mask 20, camera 41 for imaging a board mark, a mask mark, or the like is provided between mask 20 and clamping device 6. Camera 41 can be fixed to Y-axis slide 43 that slides on Y-axis rail 42, and move in the machine front-rear direction. Further, Y-axis rail 42 has X-axis slides 45 fixed to both end portions thereof, and is bridged on two X-axis rails 46 arranged in the machine width direction via X-axis slides 45. Y-axis slide 43 is moved by driving a ball screw mechanism (not illustrated) by Y-axis motor 47, and X-axis slide 45 is moved by linear motor 48. Accordingly, camera 41 can move on the XY-plane.

Figure 3:
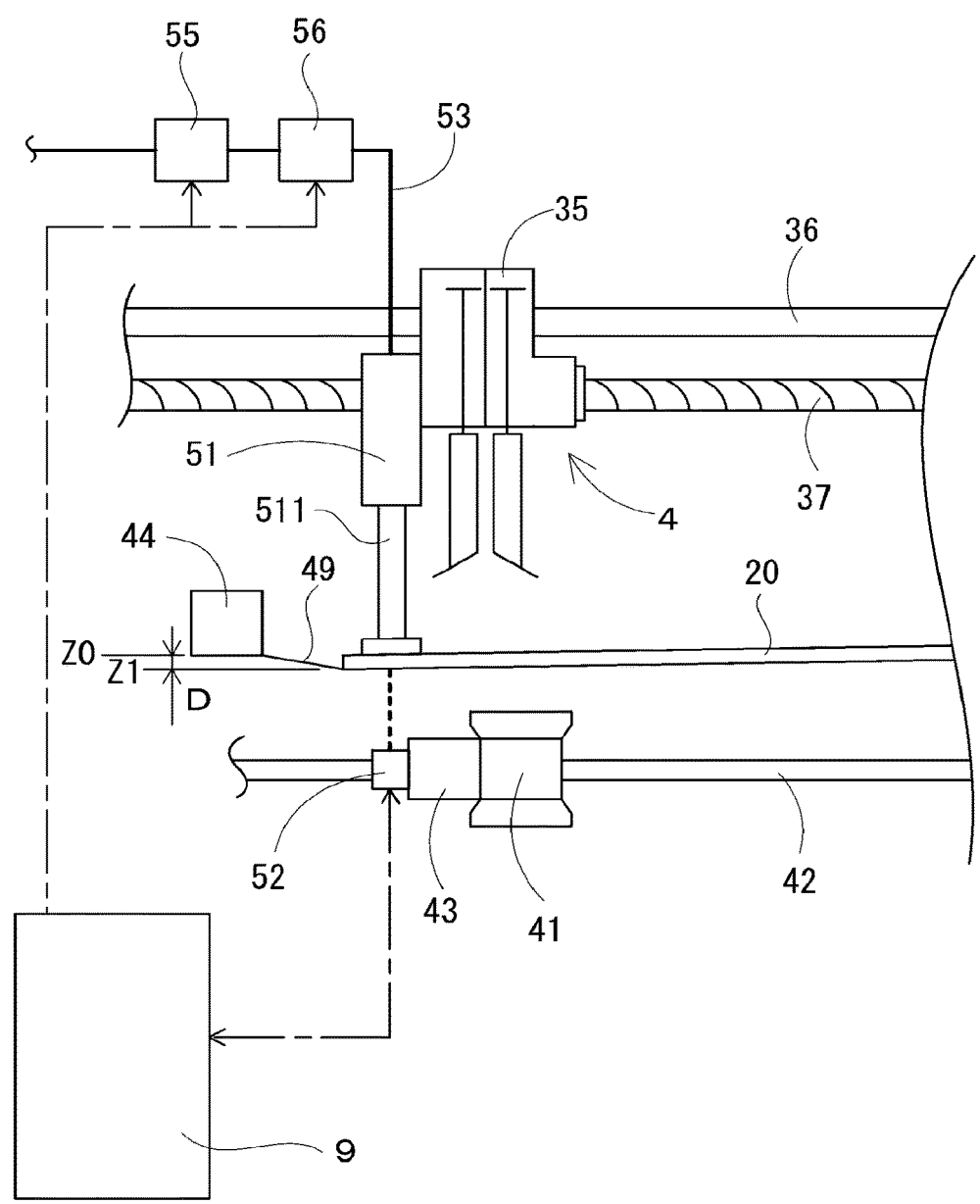
FIG. 3 is a view illustrating a main configuration of a mask tension measurement device.

Screen printer 1 is provided with a moving mechanism for moving squeegee device 4 and camera 41 above and below mask 20. Here, in screen printer 1 of the present embodiment, a mask tension measurement device for calculating the tension of mask 20 is configured by using such a mask vertical moving mechanism. FIG. 3 is a view illustrating a main configuration of the mask tension measurement device in the internal structure of screen printer 1. Specifically, there are air cylinder 51 as a pusher for pressing mask 20 downward, and laser displacement meter 52 as a mask measurement device for measuring the height of the lower surface of mask 20. Air cylinder 51 is installed on traveling table 35 on the mask, and laser displacement meter 52 is installed on Y-axis slide 43 under the mask.

Air cylinder 51 has a pressing member made of resin at the tip end of piston rod 511, and piston rod 511 is oriented downward and is attached so as to extend and contract in the vertical direction. Air cylinder 51 is a single-acting cylinder in which a piston is biased by a spring in a direction of contracting operation and is extended by an air pressure applied to the piston from the head side. Therefore, air pipe 53 is connected to air cylinder 51 such that air is supplied from a compressor (not illustrated) to the head side, and regulator 55 and three-way electromagnetic valve 56 are provided in air pipe 53.

Control device 9 is connected to regulator 55 and three-way electromagnetic valve 56, and is configured to perform drive control of each of regulator 55 and three-way electromagnetic valve 56. Accordingly, in the mask tension measurement device, the air of the set pressure is supplied to air cylinder 51 by the control of regulator 55, and the feeding of the air to air cylinder 51 and the discharge of the air in air cylinder 51 to the atmosphere are switched by the control of three-way electromagnetic valve 56. Meanwhile, laser displacement meter 52 is also connected to control device 9, and the measurement data of the height of mask 20 is transmitted to control device 9.

In screen printer 1, control device 9 that controls the entire driving is installed. Control device 9, microprocessor (CPU) 61, ROM 62, RAM 63, and non-volatile memory 64 are connected to each other via a bus line. CPU 61 performs overall control of the entire control device, and ROM 62 stores system programs to be executed by CPU 61, control parameters, and the like, and RAM 63 stores temporary computation data, display data, and the like.

Touch panel type operation display device 67 is attached to the machine front surface portion of screen printer 1, and allows the operator to input data, display the work content or numerical values, and the like. Operation display device 67 is connected to control device 9 via I/O port 65. Other various motors are connected to I/O port 65 via drivers. Servo motors are used for the various motors illustrated in the drawings, and information (signals) on the rotation amount of the motor itself can be transmitted from an encoder incorporated therein to control device 9, Furthermore, laser displacement meter 52, regulator 55, and three-way electromagnetic valve 56 are connected to I/O port 65, and the mask tension measurement device in screen printer 1 is configured. Non-volatile memory 64 of control device 9 stores the information required for the processing to be performed by CPU 61, and the printing control program of screen printer 1 to be described next is stored, and the printing process to board 10 is performed by the execution. In the present embodiment, a tension measurement program for controlling the mask tension measurement device, a use prediction calculation program for calculating the number of times of predicting the appropriate usage of mask 20, and the like are also stored.

Next, the operation of screen printer 1 will be described. In screen printer 1, board 10 is conveyed between side frames 25, uplifted by backup pins 32, and then sandwiched and held by the pair of clamp sections 27. As clamping device 6 rises, board 10 and the upper surface of mask supporting plate 211 are aligned with each other, and a mark attached to board 10 is imaged by camera 41. The positional deviation amounts of the relative positions of board 10 and mask 20 in the X, Y, and e directions are calculated, and the positional deviation correction with respect to support table 15 is performed. In addition, after lifting and lowering base 12 is raised and board 10 is positioned with respect to mask 20, a cream solder is spread by squeegee device 4 on mask 20. At this time, mask 20 is pressed against board 10 in a deflected manner, and the rolled cream solder is pressed into print pattern holes of mask 20.

Thereafter, board 10 is lowered down at a predetermined speed, mask separation is performed, board 10 is applied with the cream solder in accordance with the print pattern, and accordingly the printing is completed. However, in such printing, the quality may decrease, and one of the factors is the looseness of the mask tension. This is because, due to the loosening of the tension of mask 20, the degree of contact between mask 20 and board 10 is not compatible with the mask separation control. Here, in screen printer 1 of the present embodiment, when mask 20 is attached by the changeover, the tension determination based on the tension measurement program is automatically performed at the time point when the printing preparation is completed, such as when the machine cover is closed.

First, since multiple masks 20 having different print patterns are prepared in accordance with the circuit board to be manufactured, corresponding mask 20 is attached to screen printer 1. Then, the identifier attached to mask 20 is imaged by camera 41, and mask 20 is specified from the imaging data. Meanwhile, RAM 63 of control device 9 is configured with an information management section for managing each piece of information of multiple masks 20 stored in the stocker. For example, in addition to the print pattern of mask 20, use information (number of times of printing on board 10), use date and time, tension measurement information and measurement date and time of mask 20, and the like are stored in the management information section, and thus such information is extracted by specifying mask 20.

Next, tension measurement for pressing mask 20 by air cylinder 51 as a pusher is performed. At this time, the measurement position with respect to mask 20 is determined in accordance with the specification of mask 20 described above. Since the print pattern is different for each mask 20, each appropriate position, such as a position deviating from the pattern hole, is set. Here, traveling table 35 is moved by the drive control of squeegee motor 38, and air cylinder 51 is arranged at the measurement position of corresponding mask 20. Meanwhile, the drive control for the movement of Y-axis slide 43 is also performed under mask 20, and laser displacement meter 52 is moved and disposed so as to be positioned immediately below air cylinder 51.

In air cylinder 51 disposed at the measurement position, the piston rod 511 is extended by the supplied air, and as illustrated in FIG. 3, the measurement point of mask 20 is pushed down by the pressing member at the tip end. At this time, since the pressure of the air supplied to air cylinder 51 is adjusted by regulator 55, air cylinder 51 can always press mask 20 with a certain pressing force. However, the pressing force of air cylinder 51 can be changed by adjusting regulator 55 by an input operation of operation display device 67 in any manner.

Incidentally, in mask 20, mesh 49 made of polyester is stretched on square frame body 44 made of an aluminum alloy so as to protrude into the frame, and an outer peripheral portion of a lower surface is adhered to mesh 49 by using an adhesive. Therefore, although mask 20 is held on the inner side of frame body 44 so as to be pulled outward by mesh 49, mesh 49 and the adhesive are extremely thin, and the pulling force is lowered by cleaning or aging of mask 20. Then, as described above, the degree of contact between mask 20 and board 10 is not compatible with the mask separation control, which causes printing defect. Here as illustrated in FIG. 3, measurement is performed in the vicinity of the end portion of mask 20, which is the vicinity of mesh 49. In the present embodiment, the tension of mask 20 refers to the tension of the entire part supported by frame body 44 including mesh 49.

Meanwhile, the measurement of the height of the lower surface of mask 20 by laser displacement meter 52 is performed before and after mask 20 is pressed and bent by air cylinder 51. The value of the height of the lower surface of mask 20 in a deflected state is used for the measurement of the tension, and in the present embodiment, the tension determination is performed based on deflection amount D of mask 20. Deflection amount D has a small value in a case where the tension of mask 20 is sufficient, but has a large value in a case where mask 20 is loosened. Here, the lower surface of frame body 44 held by mask holder 3 is set to reference height Z0, while the lower surface height Z1 of mask 20 is measured at the position pressed by air cylinder 51, and difference in-between is calculated as deflection amount D, of which value is displayed on the operation display device 67 of the machine front surface portion.

As a result of the tension measurement, in a case where deflection amount D of mask 20 reaches the threshold value, the operator is notified. In the present embodiment, it is possible to input the setting of the threshold value for deflection amount D from operation display device 67. As for the threshold value, multiple threshold values can be set and input in accordance with the purpose, such as a pre-exchange threshold value for prompting preparation for exchanging with new mask 20, an exchange requiring threshold value for requiring for exchange of mask 20 that causes printing defect, and the like. The pre-exchange threshold value is a value within an allowable range that makes the proper printing of the tension possible even when mask 20 is loosened, and the exchange requiring threshold value is a value that exceeds the allowable value.

The notification to the operator is performed with operation display device 67 functioning as alerting means for an alert display or an alert voice guidance, or in a case where the alert means is such as a signal tower or the like, the alert is performed by activating such alert means. In the tension measurement program, in a case where deflection amount D exceeds the exchange requiring threshold value and the exchange of mask 20 is required, even when the operator presses the print start button together with the notification of the fact, the signal is canceled. In other words, the driving of screen printer 1 is regulated, and printing using improper mask 20 with loosened tension is avoided. Meanwhile, in a case where deflection amount D exceeds the pre-exchange threshold value, "mask exchange preparation" or the like is displayed on operation display device 67.

Figure 4:
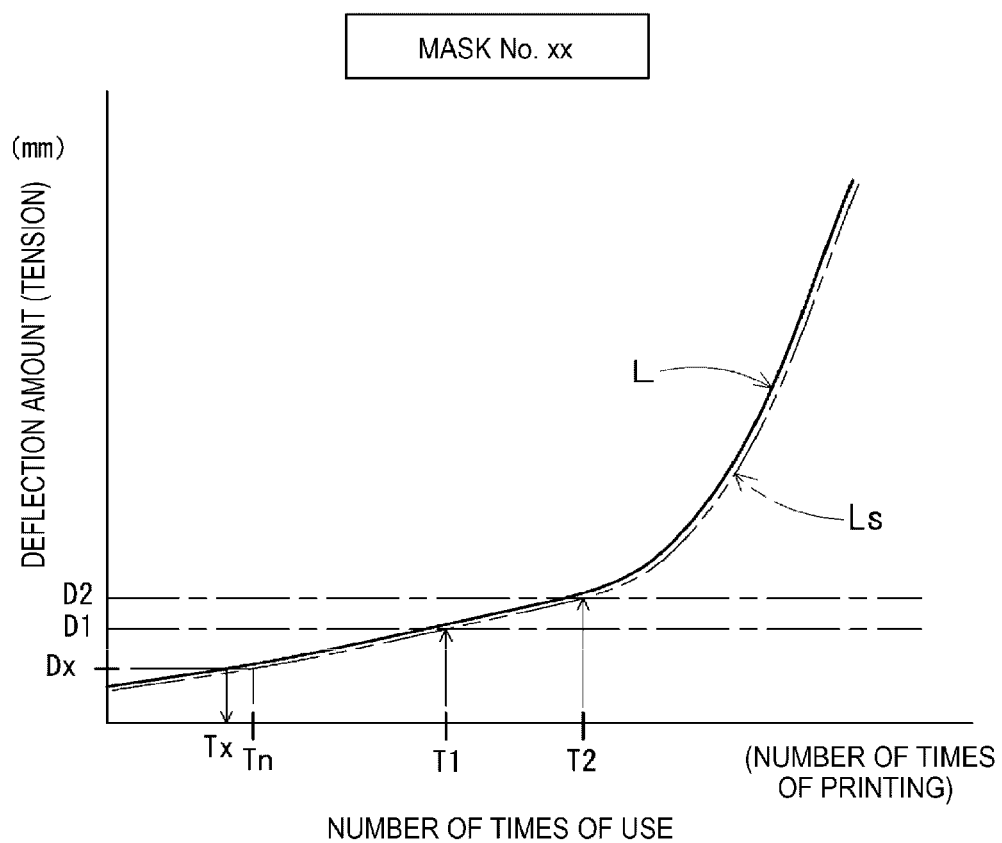
FIG. 4 is a view illustrating a tension prediction line of the mask.

Furthermore, in the present embodiment, the life prediction of mask 20 after the changeover is displayed on operation display device 67. As described above, the number of times of printing on board 10, that is, the number of times of deflecting the squeegee deflects mask 20, is counted and stored in the information management section of control device 9. Here, FIG. 4 is a graph (tension prediction line L) illustrating the relationship between the number of times of use and deflection amount D for certain mask 20. In control device 9, a tension prediction line is created by a use prediction calculation program.

When mask 20 of illustrated tension prediction line L is attached to screen printer 1, as described above, tension measurement is performed to determine deflection amount Dx, so as to determine whether the value reaches pre-exchange threshold value D1 or exchange requiring threshold value D2. In a case where neither of the threshold values is reached, the number of times of printing, of which counting starting from tension prediction line L until reaching exchange requiring threshold value D2 for requiring for the exchange, is calculated and displayed on operation display device 67. However, at this time, the number of times of use Tx with respect to deflection amount Dx does not match the actual number of times of use Tn of mask 20, which may be a case of an error occurring, In such a case, correction process is performed in which tension prediction line L is slid to correction prediction line Ls as indicated by the two-dot chain line, and the number of times of use until reaching exchange requiring threshold value D2 is calculated. Then, the difference between the number of times of use T2, which means the exchange is required, and the actual number of times of use Tn is obtained, and the value is displayed as the remaining number of times of use until the exchange is required in mask 20. The operator can determine the timing of placing an order for new mask 20 based on the usage plan and the displayed remaining number of times of use. The comparison target may be the number of times of use T1 corresponding to pre-exchange threshold value D1, indicating the exchange preparation being required, and the difference between pre-exchange threshold value D1 and the actual number of times of use Tn may be obtained and displayed.

Therefore, according to the present embodiment, since the mask tension measurement device including air cylinder 51, laser displacement meter 52, and the like is incorporated in screen printer 1, the tension of mask 20 can be measured in the machine. Since a dedicated device for measuring the mask tension is not required, the board manufacturing line can be made compact. Further, since air cylinder 51 and laser displacement meter 52 are assembled to traveling table 35 and Y-axis slide 43, the screen printer in the related art can be used as it is. Air cylinder 51 is used as the pusher, and the pressing force to mask 20 can be set by adjusting the pressure of regulator 55. In particular, the pressure adjustment of regulator 55 and the setting of the measurement position with respect to mask 20 can be easily performed by the input operation of operation display device 67.

Figure 5:
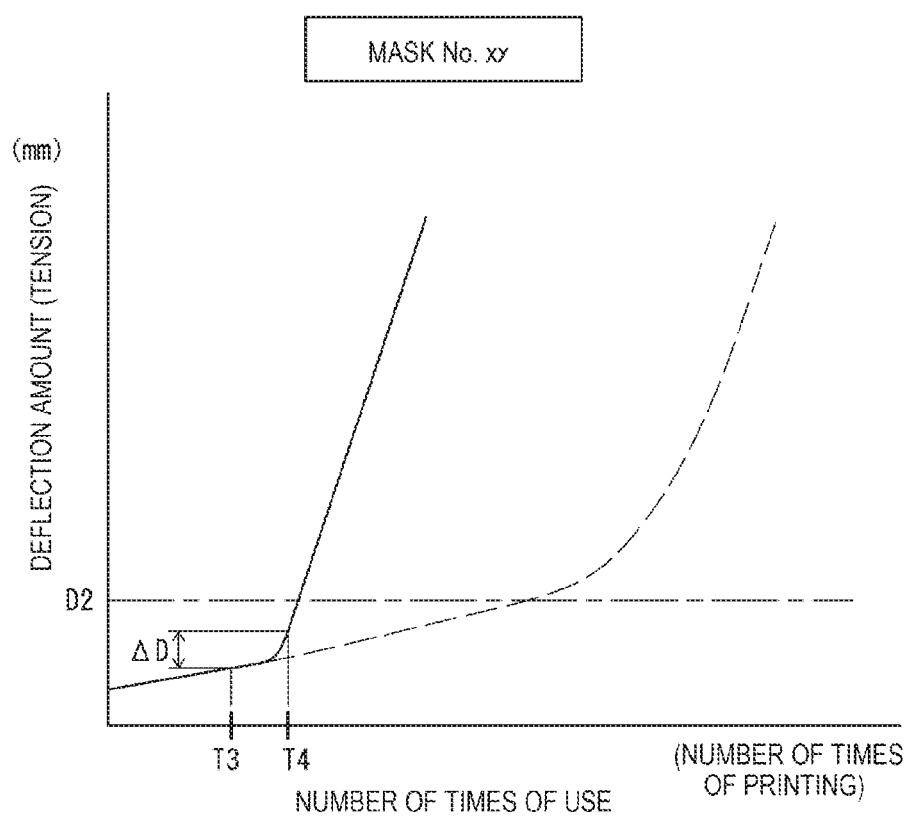
FIG. 5 is a view illustrating a tension line in a case where deflection of the mask rises sharply against the tension prediction line.

Furthermore, in screen printer 1, since the tension is measured in the machine, even when the operator incorrectly attaches defective mask 20, screen printer 1 is not driven and printing on board 10 can be avoided. Incidentally, the measurement of the tension in the machine may be performed not only at the time of the changeover in which mask 20 is attached, but also every predetermined number of times of printing. For example, in a case where there is a flaw in mesh 49, as illustrated in FIG. 5, there is a case where deflection amount D rises sharply, that is, the tension drops suddenly. In such a case, when the measurement is performed every predetermined number of times of printing, in a case where difference ΔD between the values of the deflection amounts of the numbers of times of use T3 and T4 exceeds a predetermined value, it is determined that an abnormality has occurred in mask 20, and the operator can be notified of the occurrence of the abnormality.

Further, by performing the measurement every predetermined number of times of printing, and associating measured deflection amount D with board 10 printed by mask 20 in this state, it becomes possible to perform traceability management for each production board. In screen printer 1, by imaging the identifier attached to board 10 with camera 41, board 10 can be specified from the imaging data, and can be associated with deflection amount D of mask 20 at the time of printing with respect to board 10. Such information is also useful for investigating the cause of non-defective printing products and setting pre-exchange threshold value D1 and exchange requiring threshold value D2 to appropriate values. In addition, the data of the number of times of printing and deflection amount D can also be used to create tension prediction line L illustrated in FIG. 4, and more accurate information can be obtained by increasing the number of times of measurement.

Although an embodiment of the present disclosure has been described above, the present disclosure is not limited thereto, and various changes can be made within the range that does not departs from the spirit thereof. For example, although air cylinder 51 is used as the pusher in the above-described embodiment, an electric cylinder may be used to adjust the pressing force on mask 20 by torque control of the servo motor. Further, in the above-described embodiment, mask 20 is pressed from above, but air cylinder 51 and laser displacement meter 52 may be assembled to traveling table 35 and Y-axis slide 43 in reverse and pressed from below. The mask measurement device may be camera 41 instead of laser displacement meter 52 described in the above-described embodiment, and the height of mask 20 may be obtained by image analysis of the imaging data.

In the above-described embodiment, the tension prediction line is created by the use prediction calculation program in control device 9, but a computer which can communicate with control device 9 and is provided outside screen printer 1 may create the tension prediction line. In this case, an externally provided computer may communicate with control device 9 to receive data on the number of times of use and deflection amount D, and create a tension prediction line by using a use prediction calculation program stored in the computer itself.

REFERENCE SIGNS LIST

1 . . . screen printer, 4 . . . squeegee device, 5 . . . board conveyance device, 6 . . . clamping device, 8 . . . lifting and lowering device, 9 . . . control device, 10 . . . board, 20 . . . mask, 35 . . . traveling table, 43 . . . Y-axis slide, 51 . . . air cylinder, 52 . . . laser displacement meter, 55 . . . regulator, 56 . . . three-way electromagnetic valve, 67 . . . operation display device

The invention claimed is:
1. A screen printer comprising:
a mask holding device configured to hold a mask;
a board device configured to position a board from below with respect to the mask held by the mask holding device;
a squeegee device configured to apply and spread a cream solder on an upper surface of the mask, the squeegee device being provided on a first traveling device disposed above the mask holding device;
a camera configured to image at least one of the mask and the board, the camera being provided on a second traveling device disposed below the mask holding device and above the board device;

a mask pressing device configured to press the mask at a set pressure by a pusher which is installed on one of the first traveling device or the second traveling device;

a mask measurement device, being installed on the other of the first traveling device or the second traveling device so as to be opposed to the pusher, which is configured to measure a height of the mask; and a control device configured to operate the mask pressing device so that the pusher does not press the mask, and obtain a first height measurement of mask with the mask measurement device, operate the mask pressing device so that the pusher presses the mask, and obtain a second height measurement of the mask with the mask measurement device, calculate a deflection amount of the mask based on a difference between the first height measurement and the second height measurement, and calculate a tension of the mask based on the calculated deflection amount.

2. The screen printer according to claim 1, wherein the first traveling device is a squeegee moving table for moving the squeegee device, and wherein the second traveling device is a camera moving table on which the camera is installed.

3. The screen printer according to claim 1, wherein the pusher of the mask pressing device is a single-acting air cylinder, and the mask pressing device further comprises a pressure adjustment valve which is connected on a flow path for supplying compressed air from an air supply source to the air cylinder.

4. The screen printer according to claim 1, wherein the mask measurement device is a displacement sensor or the camera.

5. The screen printer according to claim 1, wherein the control device operates the mask pressing device so that the pusher to position at a predetermined position of the mask, and causes the mask measurement device to position at the position of the pusher correspondingly.

6. The screen printer according to claim 1, wherein the control device determines that the tension of the mask is inappropriate in a case where the measured value by the mask measurement device exceeds a threshold value set in advance, and activates an alarm device to alert a tension NG information.

7. The screen printer according to claim 1, wherein the screen printer further comprises a board imaging device for imaging an identifier attached to the board, and wherein the control device has an information management section for storing information of the board specified by the identifier and the measured value measured by the mask measurement device in association with each other.

8. The screen printer according to claim 1, wherein the control device calculates a predicted number of times of printing, of which number indicating tension of the mask having reached a threshold value set for the tension of the mask, the predicted number of times of printing being calculated based on information on the number of times of printing for the mask and the measured value by the mask measurement device.

* * * * *